United States Patent
Kobrinsky et al.

(10) Patent No.: US 9,507,086 B2
(45) Date of Patent: Nov. 29, 2016

(54) OPTICAL I/O SYSTEM USING PLANAR LIGHT-WAVE INTEGRATED CIRCUIT

(75) Inventors: Mauro J. Kobrinsky, Portland, OR (US); Henning Braunisch, Chandler, AZ (US); Shawna M. Liff, Gilbert, AZ (US); Peter L. Chang, Portland, OR (US); Bruce A. Block, Portland, OR (US); Johanna M. Swan, Scottsdale, AZ (US)

(73) Assignee: Intel Corporation

( * ) Notice: Subject to any disclaimer, the term of this patent is extended or adjusted under 35 U.S.C. 154(b) by 235 days.

(21) Appl. No.: 13/996,531

(22) PCT Filed: Dec. 30, 2011

(86) PCT No.: PCT/US2011/068105
§ 371 (c)(1),
(2), (4) Date: Jun. 20, 2013

(87) PCT Pub. No.: WO2013/101184
PCT Pub. Date: Jul. 4, 2013

(65) Prior Publication Data
US 2014/0203175 A1    Jul. 24, 2014

(51) Int. Cl.
*H04B 10/25* (2013.01)
*G02B 6/12* (2006.01)
(Continued)

(52) U.S. Cl.
CPC . *G02B 6/12* (2013.01); *G02B 6/30* (2013.01); *G02B 6/428* (2013.01); *G02B 6/4214* (2013.01); *H04B 10/25* (2013.01); *G02B 2006/12061* (2013.01)

(58) Field of Classification Search
CPC ......... H04B 10/25; G02B 6/12; G02B 6/428
See application file for complete search history.

(56) References Cited

U.S. PATENT DOCUMENTS 5,416,861 A   5/1995  Koh et al.
5,515,468 A   5/1996  DeAndrea et al.
(Continued)

FOREIGN PATENT DOCUMENTS

CN  102760711 A   10/2012
JP  05-167059    7/1993
(Continued)

OTHER PUBLICATIONS

International Search Report and Written Opinion from PCT/US2011/067940 mailed Jul. 31, 2012, 10 pages.
(Continued)

*Primary Examiner* — Daniel Petkovsek
(74) *Attorney, Agent, or Firm* — Blakely, Sokoloff, Taylor & Zafman LLP

(57) ABSTRACT

Photonic components are placed on the processor package to bring the optical signal close to the processor die. The processor package includes a substrate to which the processor die is coupled, and which allows the processor die to connect to a printed circuit board. The processor package also includes transceiver logic, electrical-optical conversion circuits, and an optical coupler. The electrical-optical conversion circuits can include laser(s), modulator(s), and photodetector(s) to transmit and receive and optical signal. The coupler interfaces to a fiber that extends off the processor package. Multiple fibers can be brought to the processor package allowing for a scalable high-speed, high-bandwidth interconnection to the processor.

9 Claims, 10 Drawing Sheets

(51) Int. Cl.
*G02B 6/42* (2006.01)
*G02B 6/30* (2006.01)

(56) References Cited

U.S. PATENT DOCUMENTS

| | | | |
|---|---|---|---|
| 5,708,743 | A | 1/1998 | Deandrea et al. |
| 5,748,827 | A | 5/1998 | Holl et al. |
| 6,229,947 | B1 | 5/2001 | Vawter et al. |
| 6,364,542 | B1 * | 4/2002 | Deane et al. ............. 385/92 |
| 6,385,374 | B2 | 5/2002 | Kropp |
| 6,488,417 | B2 | 12/2002 | Kropp |
| 6,567,963 | B1 | 5/2003 | Trezza |
| 6,636,540 | B2 | 10/2003 | Uebbing |
| 6,915,032 | B1 | 7/2005 | White et al. |
| 7,018,110 | B2 * | 3/2006 | Kuhara et al. ............. 385/89 |
| 7,063,467 | B2 | 6/2006 | Nagasaka et al. |
| 7,083,333 | B2 | 8/2006 | Hodgson |
| 7,118,293 | B2 | 10/2006 | Nagasaka et al. |
| 7,316,512 | B2 | 1/2008 | Shih et al. |
| 7,343,058 | B2 * | 3/2008 | Block ............. G02B 6/12004 385/129 |
| 7,369,328 | B2 | 5/2008 | Yamamoto et al. |
| 7,539,366 | B1 * | 5/2009 | Baks et al. ............. 385/14 |
| 7,556,440 | B2 | 7/2009 | Birincioglu et al. |
| 8,238,699 | B2 * | 8/2012 | Allouche ............. 385/14 |
| 8,315,492 | B2 | 11/2012 | Chen et al. |
| 8,335,411 | B2 | 12/2012 | Kuznia et al. |
| 8,554,030 | B2 | 10/2013 | Noguchi |
| 8,666,204 | B2 | 3/2014 | Wu et al. |
| 8,676,006 | B2 | 3/2014 | Morioka |
| 8,724,944 | B2 | 5/2014 | Kuznia et al. |
| 8,787,714 | B2 | 7/2014 | Morioka |
| 8,939,657 | B2 | 1/2015 | Hung |
| 9,035,234 | B2 | 5/2015 | Wu |
| 9,046,665 | B2 | 6/2015 | Hung |
| 9,086,552 | B2 | 7/2015 | Huang et al. |
| 9,134,487 | B2 | 9/2015 | Chang et al. |
| 9,235,012 | B1 | 1/2016 | Hung et al. |
| 2002/0071639 | A1 | 6/2002 | Kropp |
| 2004/0202477 | A1 | 10/2004 | Nagasaka et al. |
| 2004/0234210 | A1 | 11/2004 | Nagasaka et al. |
| 2005/0054199 | A1 | 3/2005 | Block et al. |
| 2005/0128471 | A1 | 6/2005 | Wilsher et al. |
| 2006/0126987 | A1 | 6/2006 | Kang et al. |
| 2006/0164738 | A1 | 7/2006 | Yamamoto et al. |
| 2006/0210213 | A1 * | 9/2006 | Huang ............. G02B 6/43 385/14 |
| 2007/0077008 | A1 | 4/2007 | Jeon et al. |
| 2009/0269704 | A1 | 10/2009 | Hodono |
| 2010/0220957 | A1 | 9/2010 | Asahi et al. |
| 2012/0057822 | A1 * | 3/2012 | Wu et al. ............. 385/49 |

FOREIGN PATENT DOCUMENTS

| | | |
|---|---|---|
| JP | 2000-227529 | 8/2000 |
| JP | 2010-122312 | 6/2010 |
| JP | 2010122312 | 6/2010 |
| TW | 1278673 B | 4/2007 |
| TW | 200942887 A | 10/2009 |
| TW | 201144883 A | 12/2011 |
| TW | 201211606 A | 3/2012 |

OTHER PUBLICATIONS

International Search Report and Written Opinion from PCT/US2011/068105 mailed Jul. 31, 2012, 10 pages.
Office Action and Taiwan Search Report from foreign counterpart Taiwan Patent Application No. 101147181, mailed Aug. 11, 2014, 10 pages.
International Preliminary Report on Patentability for International Application No. PCT/US2011/067940, mailed Jul. 10, 2014, 8 pages.
International Preliminary Report on Patentability for International Application No. PCT/US2011/068105, mailed Jul. 10, 2014, 7 pages.
Office Action for U.S. Appl. No. 13/629,355, mailed Mar. 25, 2014, 12 pages.
Office Action and Taiwan Search Report from foreign counterpart Taiwan Patent Application No. 101147866, mailed Dec. 11, 2014, 11 pages.
Office Action from U.S. Appl. No. 13/996,533, mailed Dec. 16, 2014, 25 pages.
Final Office Action for U.S. Appl. No. 13/629,355, mailed Oct. 10, 2014, 22 pages.
Taiwan Appln. No. 101147866 Office Action and Search Report with Translation, 10 pgs.
Taiwan Office Action and translation for Counterpart Taiwan Application No. TW 10114786, dated Nov. 18, 2015, 7 pages.

* cited by examiner

OPTICAL I/O SYSTEM USING PLANAR LIGHT-WAVE INTEGRATED CIRCUIT

This application is a U.S. National Phase application under 35 U.S.C. §371 of International Application No. PCT/US11/68105 filed Dec. 30, 2011, and claims the benefit of priority to that International Application.

FIELD

Embodiments of the invention are generally related to processor packaging, and more particularly to a photonic components being integrated on the processor packaging.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2011, Intel Corporation, All Rights Reserved.

BACKGROUND

The demand for computing devices continues to rise, even as the demand for computing devices to achieve higher performance also rises. However, conventional electrical I/O (input/output) signaling is not expected to keep pace with the demand for performance increases. Poor scaling of bandwidth density (GB/s/mm), aggregate bandwidth (e.g., GB/s), and power efficiency (mW/Gb/s) or energy per bit (pJ/b) for conventional (electrical) I/O signaling are not expected to meet demands for future computing performance.

I/O signals are sent electrically from the processor (e.g., CPU—central processing unit) through the processor package (or just package), socket (which is sometimes not present), and board to electrical cables and/or backplanes. Current state-of-the art for electrical I/O signals between the processor and the processor package (i.e., the package in which the processor die is housed) is to use electrical connections formed by flip-chip processing (Cu bumps and solder). Electrical signals between the package and the board are also electrical in nature, and are transmitted via solder joints (in the case of BGA—ball grid array) or via a socket with pins connected to the board by solder joints (in the case of LGA—land grid array). The board communicates to the external world through connectors that mate to cables, which can be electrical or optical. In the case of Blade Servers used in Data Centers, multiple boards connect to a backplane, which in turn connects to electrical and/or optical cables.

The maximum rate that electrical I/O signals can reach, which is limited by electrical connectors, package, and board traces, is estimated at approximately 20-25 Gb/s for distances above 1 m. In addition, the need for equalization and the high losses of package and board traces and connectors result in poor scaling of energy per bit. Furthermore, the total bandwidth density is also limited by bump pitch, as well as package and board traces. Electrical I/O is not expected to meet the requirements for many applications of High Performance Computing (HPC).

While the use of photonic components finds increasing use in computing devices, current optical signaling solutions are not scalable to the level of taking greater advantage of the potential advantages of optical communication. The use of optical signals in device communication has significant potential advantages over electrical communication, namely in terms of power and theoretical bandwidth, bandwidth density, and aggregate throughput over a distance. However, the inability to cost efficiently scale the solutions prevents current optical systems from meeting the requirements of many HPC applications.

An alternative to electrical signaling in use today is based on optical cables that receive an electrical signal and convert it to optical. Such cables typically use directly-modulated VCSELs (vertical cavity surface-emitting lasers), which currently are limited to 10 Gb/s with 4 transmitter/receiver links, i.e., an aggregate bandwidth of 80 Gb/s=10 GB/s. The signaling rate is limited by the speed of the VCSEL, which is expected not to exceed 25 Gb/s in the near future.

In addition to the limits on current optical cable solutions, current optical signaling terminates far from the processor, which requires electrical-optical conversion and electrical transfer that creates a bottleneck to the processor, and results in power penalties. Serial connections to the processor are too slow to take advantage of the optical signaling throughput capabilities, and parallel connections to the processor require a significant amount of board real estate and pins to the processor package. In addition, the current components used in the optical signaling and electrical-optical coupling do not scale in a way that is usable with high-volume manufacturing.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
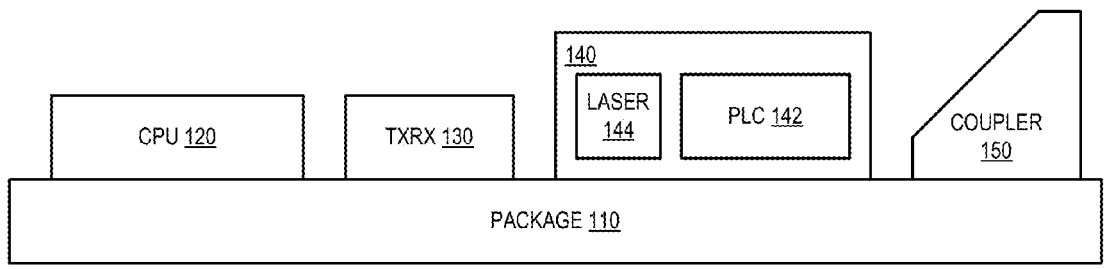
FIG. 1 is a block diagram of an embodiment of a system with photonic components disposed on processor packaging.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As described herein, photonic components are placed on the processor package. The photonics on the processor package allow the optical signals to come directly to the processor package without having to first be converted to electrical signals. The electrical-optical interfacing is performed inside the processor package without having to be integrated directly on the processor die. The resulting system is a manufacturable optical I/O system that can provide higher bandwidth density (GB/s/mm) and aggregate bandwidth (GB/s) than achievable by known electrical interconnections. Additionally, the energy per bit is much lower than with known electrical interconnections. Furthermore, as shown below, the system is scalable to higher throughputs than required by current computing systems.

The processor package includes a substrate to which transceiver logic, electrical-optical conversion circuits, and an optical coupler are coupled. There are any of a number of different possible configurations, some of which are set out in the drawings and descriptions below. Any of the configurations provides optical signaling closer to the processor die, and take advantage of existing infrastructure and processes. The electrical-optical conversion circuits include laser(s), modulator(s), and photodetector(s) to transmit and receive and optical signal. There can be one or more laser die, each containing one or more lasers. The coupler interfaces to a fiber, or multiple fibers, that extends off the processor package. Multiple fibers can be brought to the processor package allowing for multiple high-speed, high-bandwidth connections to the processor. The fiber connector can mate to a two-dimensional lens array that allows higher scalability. The components are amenable to current processing/fabrication techniques. In one embodiment, the manufacturing tolerances are tight enough to allow the use of single-mode fiber (SMF), as opposed to the current standard of multi-mode fiber (MMF).

FIG. 1 is a block diagram of an embodiment of a system with photonic components disposed on processor packaging. System 100 is a processor package. It will be understood that the elements shown are representative only of what can be included, and are not intended to be to scale. In a practical system, the processor is typically much larger than the other components. System 100 includes CPU 120. CPU 120 is intended to show any type of processor die, and is not limited to any particular processor type. Thus, use of "CPU" in the drawings and descriptions is to be understood broadly to include a processor die included in a package with photonic components according to any embodiment described herein.

CPU 120 is directly coupled to package 110, which represents a package substrate. While not shown, package 110 includes mechanisms (e.g., pins or solder connection balls) to interface system 100 to an external device, such as a printed circuit board (PCB). Package 110 can also be represented as "PKG". Package 110 includes transmit/receive (Tx/Rx—or simply "transceiver") chip 130. Transceiver 130 includes transmit and receive circuits that transfer electrical signals, and more specifically handle the timing or other protocol aspects of electrical signals corresponding to an optical signal. Transceiver 130 connects to CPU 120 over package 110, such as through traces processed into package 110. In one embodiment, CPU 120 and transceiver 130 are flip-chip bonded to package 110.

System 100 includes electrical-optical components 140, which can include lasers (such as laser die 144, which can include multiple lasers), photodetectors, and modulators. System 100 generically illustrates the components, and does not specifically illustrate the photodetectors or modulators. It will be understood that photodetectors and modulators will be positioned on the same substrate as coupler 150 to enable the transfer of light between the coupler and the electrical-optical circuits. It will be understood that "electrical-optical" could also be referred to as "optical-electrical", and refers generally herein to conversion from an electrical-to-optical signal or from an optical-to-electrical signal.

PLC 142 refers generally to any substrate for electrical-optical circuits. PLC can specifically mean "planar light-wave chip" or "planar light-wave circuit", and refers to integrated components that provide a plane for the transfer of light and its conversion to electrical signals, and vice versa. Laser 144 can be any type of laser chip suitable for producing optical signals, such as an edge-emitting device or a VCSEL. In one embodiment, PLC 142 is an inorganic PLC, which has a lower CTE (coefficient of thermal expansion) than organic materials, which minimizes CTE mismatches for better alignment and lower stresses during reflow processing.

Coupler 150 provides a redirection mechanism to exchange light between system 100 and something external to system 100 (e.g., another device). In one embodiment, coupler 150 includes a total-internal-reflection (TIR) surface to direct the optical signals without significant optical loss. The angle and general dimensions and shape of coupler 150 are dependent on the wavelength of optical light, as well as the material used to make the coupler. In one embodiment, glass or other material transparent at the wavelengths of interest is used to mold coupler 150. Vertical transmission of light to and from a substrate is well understood and will not be discussed in-depth herein. Coupler 150 is designed to provide vertical redirection to and from substrate 110. In one embodiment, coupler 150 provides a 9-degree redirection of optical signals. In one embodiment, coupler 150 redirects the optical signals 90 degrees between a fiber and a mirror or other mechanism. In one embodiment, the mirror or other mechanism can turn the optical signals another 90 degrees to interface with waveguides or optical pathways that have a parallel direction of focus as the lens interfaces of the optical coupler to interface with the fiber(s). In one embodiment, the mirror is included in coupler 150, or in an interface (for example, interface 344 of FIG. 3A) of coupler 150 to substrate 110.

In system 100, the transceiver circuits (transceiver 130) are brought physically close to the electrical-optical conversion (by components 140), which increases the efficiency of the system. Additionally, the transceiver circuits are physically close to the processor die (CPU 120), being inside the processor package.

In general, system 100 or any configuration described below in reference to the other figures, provides on-package electrical-optical conversion. Thus, the conversion takes place close to the source/destination of the electrical signals (the processor die). Additionally, the systems are manufacturable in that they are compatible with current CMOS (complementary metal-oxide-semiconductor) processing infrastructure as well as with high volume manufacturing (HVM) techniques.

As described herein, the systems do not depend on directly-modulated VCSELs, which currently have a maximum signaling rate of 10 Gb/s. Additionally, they avoid the need to transmit high speed signals through long package traces and connectors. Thus, the described system configurations are able to achieve higher aggregate bandwidths and bandwidth densities, and higher bit rates, while using lower power per bit. As described herein, the systems can provide aggregate bandwidths of 128 GB/s and higher, bandwidth densities above 5 GB/s/mm at energies below 5 pJ/b. The higher aggregate bandwidths can be reached without WDM (wave division multiplexing). In one embodiment, WDM is used and would result in a further increase of aggregate bandwidth and bandwidth density, but the values mentioned above are achievable without the use of WDM.

Figure 2:
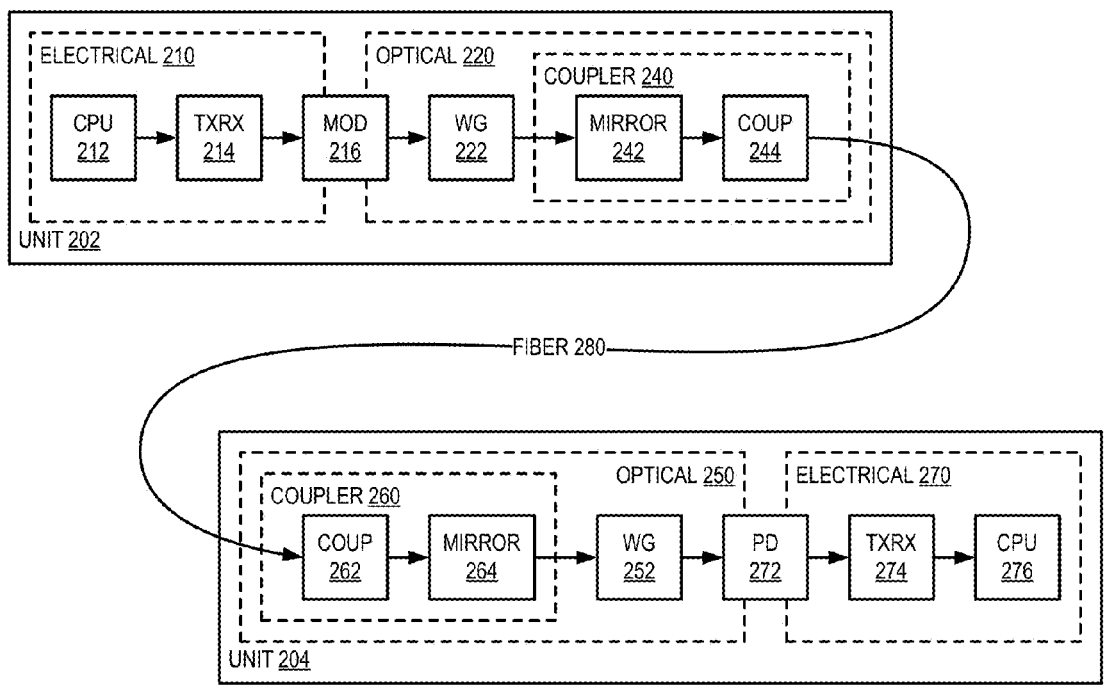
FIG. 2 is a block diagram of an embodiment of an optical interconnection between processor packages.

FIG. 2 is a block diagram of an embodiment of an optical interconnection between processor packages. System 200 is a processor system in which system 100 or any other processor configuration system could be used. More specifically, system 200 illustrates communication or an I/O signal path between two devices enabled with on-package electrical-optical conversion.

Unit 202 includes one processor, while unit 204 includes another. Units 202 and 204 could be on the same computing device, or on different computing devices. In one embodiment, fiber 280 is not a single fiber, but multiple fibers with associated interconnections, which may include active components to propagate an optical signal between the units.

In the example shown, unit 202 is the transmitting device and unit 204 is the receiving device, as shown by the direction of the arrows. Unit 202 initiates an I/O signal in its electrical components 210. More particularly, CPU 212 is a processor that generates a signal to send to unit 204. CPU 212 generates an electrical signal, which is then processed for timing and formatting by transceiver 214. More particularly, in one embodiment, transceiver 214 can multiplex signals into a higher rate. Thus, the signals could propagate through the package at a lower rate than the final transmission rate and then multiplexed into the higher rate signal by transceiver 214. In another embodiment, CPU 212 sends the signals at the final rate, and transceiver 214 does not need to multiplex the signals. It will be understood that due to the multiplexing capability, the final I/O rate is not limited by the high losses and poor electrical properties of boards.

In one embodiment, transceiver 214 is located on a PLC. In such a case, from CPU 212 the signal reaches the package (not specifically shown) via standard Cu-solder bumps, and travels through standard package traces to reach the transceiver die on the PLC. In another embodiment, transceiver 214 is included on CPU 212, in which case the signal is transmitted to the transceiver over on-die traces.

Transceiver 214 drives modulator (mod) 216 to selectively generate optical pulses or pulses of light. Multiple optical pulses in succession are the optical signal, or an optical signal to represent the electrical I/O signal generated by CPU 212. Optical components 220 then propagate the I/O signal to transmit it out of unit 202 to unit 204. The optical pulses travel through waveguides on the package (e.g., either in a PLC or in the package substrate).

Transceiver 214 then drives modulator 216 to generate optical pulses or pulses of light. The series or succession of optical pulses represents the optical signal, or the optical version of the I/O signal generated electrically by CPU 212. The optical pulses then travel through optical components 220 to be transmitted from unit 202 to unit 204. More particularly, the optical signal travels down waveguides (wg) 222. The waveguides can be manufactured directly into the package substrate or be part of a PLC. Waveguide 222 conveys the optical signal to coupler 240, which can include mirror 242 to deflect or redirect the optical signal through coupler 244 into optical fiber 280.

On the receiving end, unit 204 includes optical components 250, which include coupler 260 and waveguides 252. Coupler 264 receives the optical signal from fiber 280, which is then redirected by mirror 264 and propagated through waveguide 252 to electrical components 270. Electrical components 270 include detector 272, which converts the light into a current. As shown, both modulator 216 and detector 272 straddle between electrical and optical components as represented in system 200. This is merely intended to represent that in modulator 216 an electrical signal is received and an optical signal produced, while in detector 272 an optical signal is received and an electrical signal produced.

Transceiver 274 receives the current originating at detector 272, which it then converts into a standard voltage digital signal. Transceiver 274 transmits the voltage digital signal to CPU 276. In one embodiment, the transmitting from transceiver 274 to CPU 276 is done through TSVs and package traces.

Figure 3A:
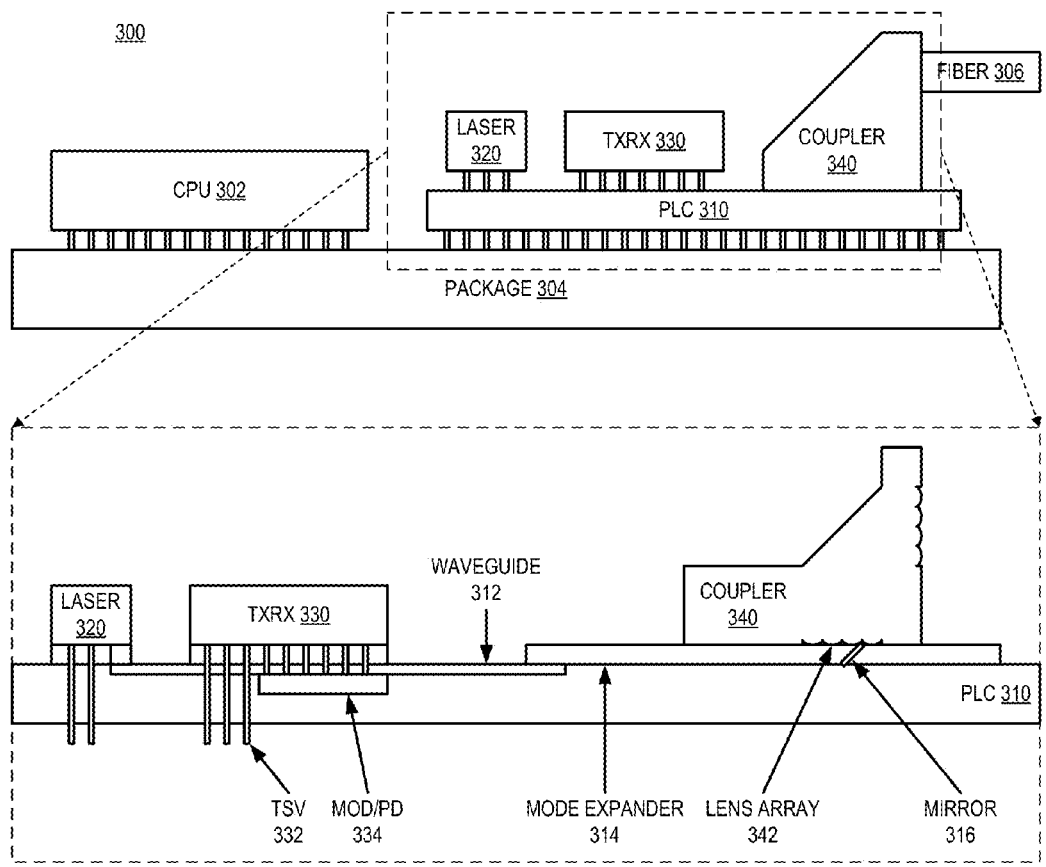
FIG. 3A is a block diagram of an embodiment of a configuration of a system with photonic components disposed on processor packaging with separate transceiver and photonic chips.

FIG. 3A is a block diagram of an embodiment of a configuration of a system with photonic components disposed on processor packaging with separate transceiver and photonic chips. System 300 represents a processor with optical components integrated on it. The processor includes package 304, which is a substrate on which the processor die, CPU 302, and the optical components (inside the dashed box) are disposed.

Package 304 is a standard package to which a standard CPU and PLC 310 are attached. As mentioned above, "PLC" can mean planar light-wave circuit, or planar light-wave chip, especially when represented as a standalone chip as in system 300. PLC 310 has TSVs, integrated waveguides, modulators, and detectors. In one embodiment, PLC 310 does not include transistors, which significantly lowers cost and drastically decreases fabrication complexity. In one embodiment, PLC 310 can be fabricated in a standard CMOS fab. PLC 310 is preferably thinned to enable TSV processing. In one embodiment, PLC 310 is thinned to about 100 μm for TSV processing.

The TSVs are more particularly shown in the blown-up view as TSV 332. The TSVs allow the chips to connect directly to package 304 through PLC chip 310. TSVs 332 provide a three-dimensional package architecture. TSVs 332 enable an electrical connection through a chip. Wire bonding could be used as an alternative to TSVs, but would be expected to have poorer performance.

In one embodiment, PLC 310 includes transceiver chip 330, which is based on CMOS or another suitable technology, laser die 320, and coupler 340. The components can be attached to PLC 310 by assembly processes, such as TCB (thermo-compression bonding) or other suitable processing. Laser die 320 is the source of light, and is generally a III-V chip, which can contain one laser or an array of lasers. In the case of an array of lasers, continuous wave (CW) lasers (constantly on) and modulators 334 can be used by transceiver 330 to generate optical pulses according to electrical digital signals arriving to the circuit. Laser 320 produces light and couples to waveguide 312 via coupling structures (e.g., edge couplers, evanescent coupling, or grated couplers).

In one embodiment, transceiver 330 has two primary functions: (i) receive electrical signals from CPU 302, multiplex them as needed, and then drive modulator 334 to generate an optical pulse on light produced by laser 320; and, (ii) receive current pulses from photodetectors 334, which are converted into standard digital electrical signals (e.g., using a trans-impedance amplifier—TIA), and are then transmitted to CPU 302 using standard protocols such as On-Package I/O (OPIO). It will be understood that a TIA is included with the transceiver logic, or in the CPU to interface with the transceiver logic, for each of the configurations described herein. In embodiments where the transceiver logic is integrated into the processor die (for example, see FIG. 4 below), the TIA is also integrated into the processor die.

Coupler 340 enables light signals to travel between PLC 310 and fiber bundles 306. Coupler 340 may or may not include a lens array. In the blow-up, an embodiment is shown where coupler 340 includes a lens array. In one embodiment, coupler 340 can attach to a standard multi-terminal (MT) connector carrying 12, 24, 36, or 48 single-mode fibers. In addition to modulators, photodetectors, and waveguides, PLC 310 includes structures that redirect the light to enable the optical signals to be coupled between on-PLC waveguides and coupler 340. In one embodiment, the redirection is 90 degrees. The redirection structures can include some or all of the following: lenses, 45-degree mirrors or gratings or bent fibers/waveguides that turn light 90 degrees, and mode expanders 314 that change the light spot size (mode) to avoid mismatch that would otherwise exist between on-PLC waveguides (with cores in the range 0.1-10 μm) and fibers (with cores on the order of several microns for single mode fibers, and on the order of tens of microns for multimode fibers). As shown, mirror 316 is used to provide 90 degree redirection from PLC 510 to lens array 342 of coupler 340. PLC 310 also contains coupling structures that enable coupling of light from laser chip 320 to PLC 310.

It will be understood that CPU 302, laser 320, and package 340 can be standard components that are currently used. Additionally, system 300 can be assembled using current industry-standard assembly components and process flows. In one embodiment, alignment tolerances are tighter (submicron) than standard industry tolerances (~5-10 μm), which requires additional mechanisms in place in the otherwise standard process flows to guarantee such tolerances. In particular, the integration of coupler 340 to PLC 310 needs to be monitored to align the optical pathways. Simulation thermal assessments indicate that currently standard thermal solutions, based on a heat spreader, are sufficient to provide the needed thermal performance of system 300.

System 300 could be modified by replacing laser 320 with an array of directly modulated lasers. In one embodiment, the light from each laser of laser chip 320 is directed to a single waveguide to support a single modulator. In an alternative embodiment, the light from each laser of laser chip 320 is split into multiple (e.g., two or three) waveguides to support a corresponding number of modulators. The maximum number of modulators that can be supported by each laser in the laser array depends on the power of each laser, the link loss budget, the responsivity, and dark current of the detectors, as well as the signal rate. For example, for 7.6 mW lasers, detectors with 0.65 responsivity and 10 uA of dark current, and a link loss budget of 18 dB, two modulators can be supported by each laser at a signal rate of 25 Gb/s.

As mentioned above, tighter tolerances can be used to support connections to single mode fiber. In an alternate embodiment, fibers 306 are multimode fibers. The use of multimode fibers may allow the use of less stringent alignment tolerances. In one embodiment, the electrical-optical materials are spin-on electrical-optical polymers (EOPs) that are compatible with standard CMOS processes and materials. In an alternative embodiment, the electrical-optical materials are ferroelectric oxides (e.g., $LiNbO_3$), or piezo-electric materials (e.g., PLTZ), or electro-absorption materials (III-V or Germanium quantum well devices, where an electric signal controls the absorption of light), or Si (forming a Si MOS capacitor).

In one embodiment, PLC 310 is separated into multiple chips, for example, one to which laser 320 and transceiver 330 are attached, and another to which coupler 340 is attached. The PLC under coupler 340 could potentially be thicker than the PLC under laser 320 and transceiver 330, if TSVs are used. In one embodiment, CPU 302 and PLC 310 are packaged using Bumpless Buildup Layer (BBUL) technology. In one embodiment, WDM is used.

Figure 3B:
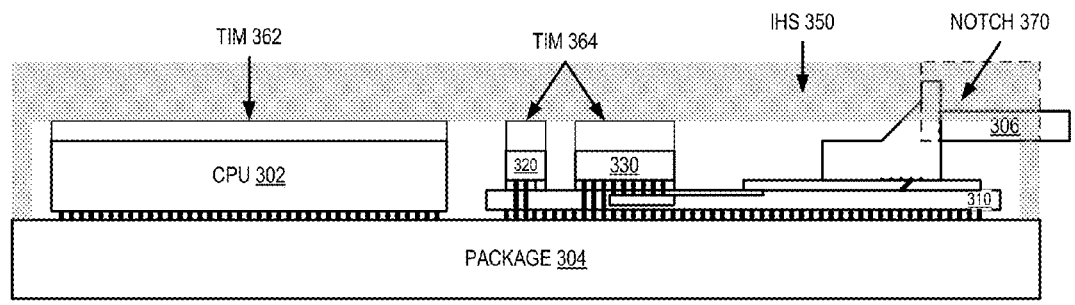
FIG. 3B is a block diagram of an embodiment of the circuit of FIG. 3A in a sealed processor packaging with an integrated heat spreader.

FIG. 3B is a block diagram of an embodiment of the circuit of FIG. 3A in a sealed processor packaging. System 300 is provided with a standard thermal solution. IHS (integrated heat spreader) 350 is a standard material used to provide a thermal dissipation pathway for the processor. Typically a material is used to make contact between the chip components and the IHS to provide better thermal transfer. Any standard thermal interface material (TIM) known to those skilled in the art can be used to thermally connect CPU 302, laser 320, and transceiver 330 to IHS 350. As shown in FIG. 3B, TIM 362 connects CPU 302 to IHS 350, and TIM 364 connects laser 320 and transceiver 330 to IHS 350. Notch 370 is a cut-out portion that allows coupler 340 and a fiber connector holding fibers 306 to extend out away from the final package assembly.

Figure 4:
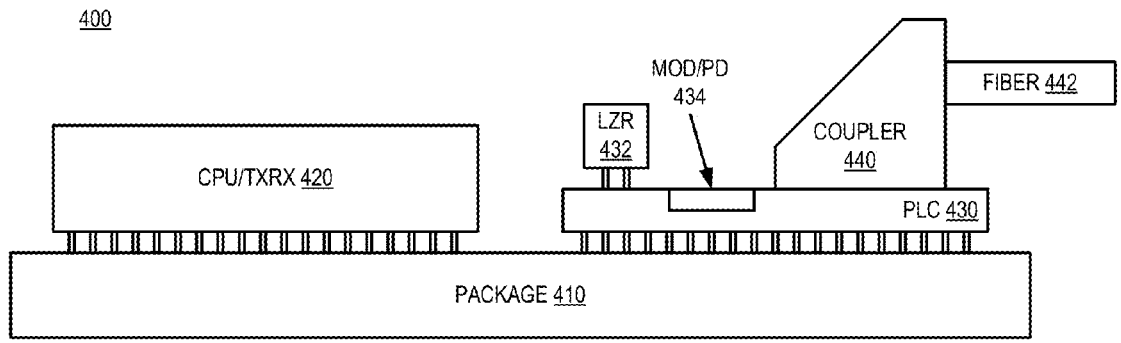
FIG. 4 is a block diagram of an embodiment of a configuration of a system with photonic components disposed on processor packaging with a separate photonic chip and integrated transceiver on the CPU.

FIG. 4 is a block diagram of an embodiment of a configuration of a system with photonic components disposed on processor packaging with a separate photonic chip and integrated transceiver. System 400 represents a processor with optical components integrated on it. The processor includes package 410, which is a substrate on which the processor die, CPU 420, and the optical components on PLC 430 are disposed. PLC 430 includes laser (lzr) 432, and coupler 440 that interfaces with fiber 442.

The primary distinction between system 400 and system 300 is that CPU 420 includes transceiver logic and a trans-inductance amplifier. Thus, it is labeled CPU/TXRX 420 in system 400. System 400 illustrates that transceiver logic can be integrated onto the processor die. Integrating the transceiver chip into the CPU simplifies the assembly process, at least because it saves a 3D-assembly step. On the other hand, CPU 420 must then be customized to include Tx (transmit) and Rx (receive) functions that would not be present if an electrical I/O system were used.

System 400 minimizes the number and power requirements of TSVs. In one embodiment of system 400, I/O signals will not be able to be multiplexed or demultiplexed at PLC 430, since it does not have a transceiver die, and can be made without transistors. Adding the transistors necessary to mux/demux at PLC 430 would add increased complexity to the design. If no active processing logic is included on PLC 430, the maximum I/O rate is expected to be approximately 25 Gb/s. In addition to the potential limits on I/O rate, the photodetector current signals need to travel a relatively long distance (mm) along package traces, which could actually be the true limiter of the signaling rate of system 400.

PLC 430 represents the electrical-optical circuits, and includes laser 432, and modulator and photodetector circuits 434. In one embodiment, laser 432 is an array of directly modulated lasers. In one embodiment, the light from each laser of laser chip 432 is directed to a single waveguide to support a single modulator. In an alternative embodiment, the light from each laser of laser chip 432 is split into multiple (e.g., two or three) waveguides to support a corresponding number of modulators.

As with system 300, in one embodiment, system 400 can be assembled using standard assembly equipment and flows, with the possible exception of tighter alignment tolerances to support single mode fiber (SMF). In an alternate embodiment, fibers 442 are multimode fibers, which may allow the use of less stringent alignment tolerances. In one embodiment, the electrical-optical materials are spin-on EOPs that are compatible with standard CMOS processes and materials. In an alternative embodiment, the electrical-optical materials are ferroelectric oxides (e.g., LiNbO3), or piezoelectric materials (e.g., PLTZ), or electro-absorption materials (III-V or Germanium quantum well devices, where an electric signal controls the absorption of light), or Si (forming a Si MOS capacitor). In one embodiment, PLC 430 is separated into multiple chips. In one embodiment, CPU 420 and PLC 430 are packaged using Bumpless Buildup Layer (BBUL) technology.

Figure 5:
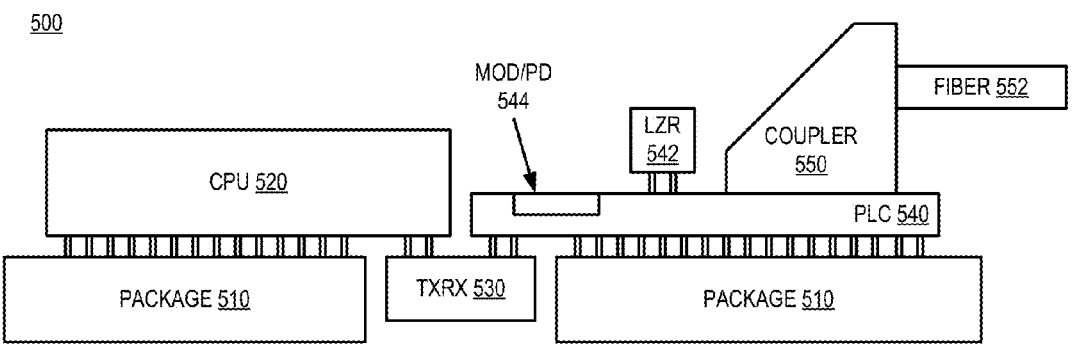
FIG. 5 is a block diagram of an embodiment of a configuration of a system with photonic components disposed on processor packaging with separate transceiver and photonic chips, where the transceiver chip is flip-chip bonded between the processor and photonics.

FIG. 5 is a block diagram of an embodiment of a configuration of a system with photonic components disposed on processor packaging with separate transceiver and photonic chips, where the transceiver chip is flip-chip bonded between the processor and photonics. System 500 represents a processor with optical components integrated on it. The processor includes package 510, which is a substrate on which the processor die, CPU 520, and the optical components on PLC 540 are disposed. PLC 540 includes laser (lzr) 542, and coupler 550 that interfaces with fiber 552.

The primary distinction between system 500 and system 300 is that system 500 includes a "Si bridge" added to provide a high speed medium between CPU 520 and PLC 540. System 500 enables higher signaling rates and aggregate bandwidth than either system 300 or system 400. The silicon bridge contains high density interconnects, as well as active devices to enable a TIA that converts the photodetector current into a digital pulse. Transceiver 530 represents the silicon bridge or SiB.

In system 500, multiplexing and demultiplexing functions may not be needed. However, multiplexing and demultiplexing can still be advantageous. For example, from a power and/or signal integrity perspective, it can be preferable to have more connections at the CPU end of the active SiB and a correspondingly lower speed at that interface, compared to the SiB/PLC interface. System 500 increases the complexity of assembly and cost due to the SiB assembly, and would use non-standard packages with a thru-hole cavity. While a cross section is shown, it will be understood that package 510 extends around transceiver 530, which is in a "hole" in package 510.

PLC 540 represents the electrical-optical circuits, and includes laser 542, and modulator and photodetector circuits 544. In one embodiment, laser 542 is an array of directly modulated lasers. In one embodiment, the light from each laser of laser chip 542 is directed to a single waveguide to support a single modulator. In an alternative embodiment, the light from each laser of laser chip 542 is split into multiple (e.g., two or three) waveguides to support a corresponding number of modulators.

As with system 300, in one embodiment, system 500 can be assembled using standard assembly equipment and flows, with the possible exception of tighter alignment tolerances to support single mode fiber (SMF). In an alternate embodiment, fibers 552 are multimode fibers, which may allow the use of less stringent alignment tolerances. In one embodiment, the electrical-optical materials are spin-on EOPs that are compatible with standard CMOS processes and materials. In an alternative embodiment, the electrical-optical materials are ferroelectric oxides (e.g., LiNbO3), or piezoelectric materials (e.g., PLTZ), or electro-absorption materials (III-V or Germanium quantum well devices, where an electric signal controls the absorption of light), or Si (forming a Si MOS capacitor).

In one embodiment, PLC 540 is separated into multiple chips, each with a corresponding transceiver 530. In one embodiment, CPU 520, transceiver 530, and PLC 540 are packaged using Bumpless Buildup Layer (BBUL) technology. In one embodiment, WDM is used to increase aggregate bandwidth. In one embodiment, transceiver 530 does not contain active devices, but all transmit and receive functions are handled by CPU 520.

Figure 6:
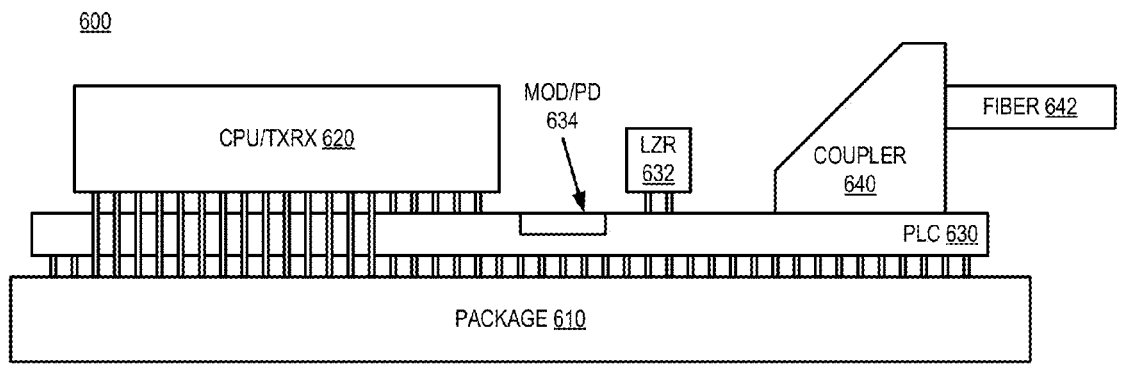
FIG. 6 is a block diagram of an embodiment of a configuration of a system with photonic components disposed on processor packaging with an integrated processor and transceiver chip disposed on a photonic substrate.

FIG. 6 is a block diagram of an embodiment of a configuration of a system with photonic components disposed on processor packaging with an integrated processor and transceiver chip disposed on a photonic substrate. System 600 represents a processor with optical components integrated on it. The processor includes package 610, which is a substrate to which the processor die, CPU 620, and the optical components on PLC 630 are connected. PLC 630 includes laser (lzr) 632, and coupler 640 that interfaces with fiber 642.

The primary distinction between system 600 and system 300 is that in system 600, PLC 630 acts as an interposer (e.g., silicon or other material) onto which CPU 620, laser 632, and coupler 640 are attached by assembly methods. CPU 620 includes transceiver logic (as is thus labeled CPU/TXRX 620). PLC 630 includes TSVs through which CPU 620 connects to package 610. PLC 630 also includes photodetector(s) and modulator(s) 634, and waveguide(s). In one embodiment, system 600 enables higher signaling rates and aggregate bandwidth than systems 300 and 400 by avoiding the use of package traces.

System 600 enables PLC 630 to provide a high quality signaling medium between CPU 620 and PLC 630, similar to the use of SiB 530 above. In contrast to system 500, however, system 600 can be produced using standard packages and assembly flows. The size of the die required for PLC 630 could be a constraining factor on manufacturing cost for the immediate future. Additionally, there is a possibility of warpage at assembly as the PLC wafer is expected to need to be thinned to approximately 100 µm to allow for the use of TSVs. In one embodiment, PLC 630 is substantially thicker than 100 µm.

PLC 630 represents the electrical-optical circuits, and includes laser 632, and modulator and photodetector circuits 634. In one embodiment, laser 632 is an array of directly modulated lasers. In one embodiment, the light from each laser of laser chip 632 is directed to a single waveguide to support a single modulator. In an alternative embodiment, the light from each laser of laser chip 632 is split into multiple (e.g., two or three) waveguides to support a corresponding number of modulators.

As with system 300, in one embodiment, system 600 can be assembled using standard assembly equipment and flows, with the possible exception of tighter alignment tolerances to support single mode fiber (SMF). In an alternate embodiment, fibers 642 are multimode fibers, which may allow the use of less stringent alignment tolerances. In one embodiment, the electrical-optical materials are spin-on EOPs that are compatible with standard CMOS processes and materials. In an alternative embodiment, the electrical-optical materials are ferroelectric oxides (e.g., LiNbO3), or piezoelectric materials (e.g., PLTZ), or electro-absorption materials (III-V or Germanium quantum well devices, where an electric signal controls the absorption of light), or Si (forming a Si MOS capacitor).

In one embodiment, PLC 630 is separated into multiple chips. In one embodiment, CPU 620 and PLC 630, or just PLC 630, are packaged using Bumpless Buildup Layer (BBUL) technology. In one embodiment, WDM is used to increase aggregate bandwidth.

Figure 7:
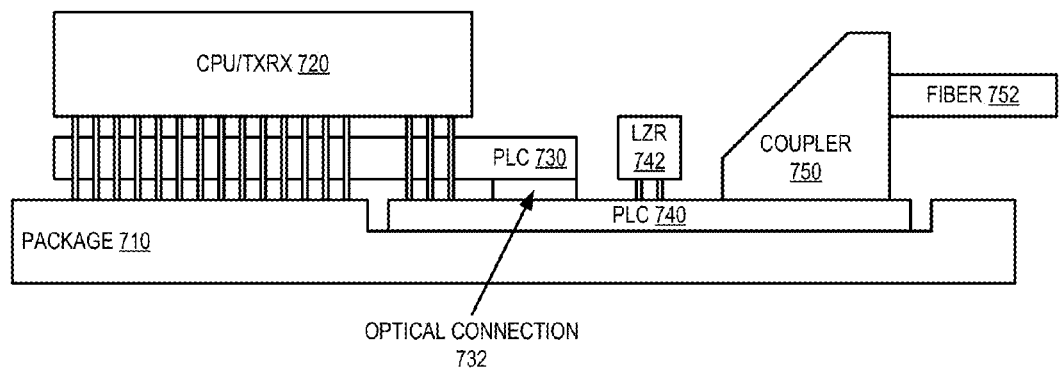
FIG. 7 is a block diagram of an embodiment of a configuration of a system with photonic components disposed on processor packaging with an integrated processor and transceiver chip disposed on a photonic substrate, and a second photonic substrate couples the first substrate to an optical coupler.

FIG. 7 is a block diagram of an embodiment of a configuration of a system with photonic components disposed on processor packaging with an integrated processor and transceiver chip disposed on a photonic substrate, and a second photonic substrate couples the first substrate to an optical coupler. System 700 represents a processor with optical components integrated on it. The processor includes package 710, which is a substrate to which the processor die, CPU 720, and the optical components are connected.

In systems above it is disclosed as an option that the PLC could be separated into multiple chips. System 700 illustrates PLC 730 as a silicon interposer onto which CPU 720 is attached. CPU 720 includes transceiver logic (as is thus labeled CPU/TXRX 720). PLC 730 includes TSVs through which CPU 720 connects to package 710. A second PLC die, PLC 740 includes laser (lzr) 742, and coupler 750 that interfaces with fiber 752. Splitting the PLC into two separate die minimizes fabrication processing, but increases assembly complexity.

PLC 730 includes photodetector(s) and modulator(s). PLC 730 places the modulator(s) and detector(s) in close proximity to the transceiver and CPU 720, which minimizes power usage. PLC 740 includes waveguides and couplers, and laser source 742 attached by using assembly processes. The two PLCs need to have both electrical and optical connections 732. In addition, package 710 needs to include a cavity in which PLC 740 is placed.

System 700 enables a high quality signaling medium between CPU 720 and PLC 730 and PLC 740. In one embodiment, PLC 730 and PLC 740 are of different thicknesses, as PLC 730 can be made thinner to accommodate TSVs for CPU 720, while PLC 740 may not need to accommodate such TSVs, and could be made thicker. In one embodiment, both PLCs are the same thickness, and are both substantially thicker than 100 µm.

In one embodiment, laser 742 is an array of directly modulated lasers. In one embodiment, the light from each laser of laser chip 742 is directed to a single waveguide to support a single modulator. In an alternative embodiment, the light from each laser of laser chip 742 is split into multiple (e.g., two or three) waveguides to support a corresponding number of modulators.

As with system 300, in one embodiment, system 700 can be assembled using standard assembly equipment and flows, with the possible exception of tighter alignment tolerances to support single mode fiber (SMF). In an alternate embodiment, fibers 752 are multimode fibers, which may allow the use of less stringent alignment tolerances. In one embodiment, the electrical-optical materials are spin-on EOPs that are compatible with standard CMOS processes and materials. In an alternative embodiment, the electrical-optical materials are ferroelectric oxides (e.g., LiNbO3), or piezoelectric materials (e.g., PLTZ), or electro-absorption materials (III-V or Germanium quantum well devices, where an electric signal controls the absorption of light), or Si (forming a Si CMOS capacitor). In one embodiment, CPU 720, PLC 730, and/or PLC 740 are packaged using Bumpless Buildup Layer (BBUL) technology. In one embodiment, WDM is used to increase aggregate bandwidth.

Figure 8:
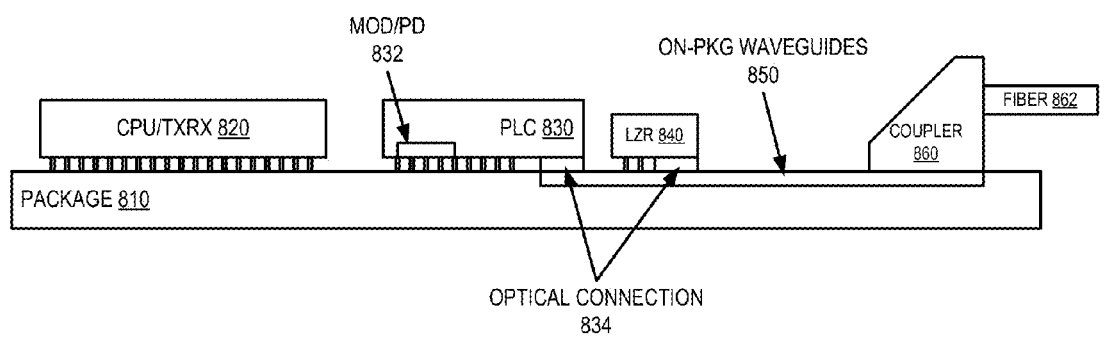
FIG. 8 is a block diagram of an embodiment of a configuration of a system with photonic components disposed on processor packaging with an integrated processor and transceiver chip, a photonic chip, and waveguides integrated into the processor packaging.

FIG. 8 is a block diagram of an embodiment of a configuration of a system with photonic components disposed on processor packaging with an integrated processor and transceiver chip, a photonic chip, and waveguides integrated into the processor packaging. System 800 represents a processor with optical components integrated on it. The processor includes package 810, which is a substrate on which the processor die, CPU 820, and the optical components are disposed. Optical components include PLC 830 and laser (lzr) 840. The optical components enable transferring optical signals between CPU 820 and fiber 862 through coupler 860.

In system 800, package 810 has optical waveguides 850 integrated right into the substrate, and package 810 (the substrate) fulfills many of the optical functions that the PLC has in other systems described above. CPU 820 includes transceiver logic, and is labeled CPU/TXRX 820. As discussed above, integrating the transceiver chip into CPU 820 simplifies the assembly process of system 800, but requires customization of the processor die to include Tx (transmit) and Rx (receive) functions that would not be present if an electrical I/O system were used.

In one embodiment PLC 830 does not contain TSVs, and no thinning of the die is performed (it is a full or standard thickness die). Laser 840, PLC 830, and coupler 860 are attached to package 810 using assembly processes. The modulator and photodetectors 832 are contained in PLC 830. Package 810 includes on-package waveguides 850 to which PLC 830 and laser 840 connect via optical connections 834. System 800 allows PLC 830 to be smaller, simpler, and lower in cost to other configurations discussed above. However, system 800 is only reasonably effective if high quality single-mode waveguides are provided in the package, which may not be available in the immediate future.

PLC 830 represents the electrical-optical circuits, and includes laser 840, and modulator and photodetector circuits 832. In one embodiment, laser 840 is an array of directly modulated lasers. In one embodiment, the light from each laser of laser chip 840 is directed to a single waveguide to support a single modulator. In an alternative embodiment, the light from each laser of laser chip 840 is split into multiple (e.g., two or three) waveguides to support a corresponding number of modulators. In one embodiment, PLC 830 is separated into more than one die.

As with system 300, in one embodiment, system 800 can be assembled using standard assembly equipment and flows, with the possible exception of tighter alignment tolerances to support single mode fiber (SMF). In an alternate embodiment, fibers 862 are multimode fibers, which may allow the use of less stringent alignment tolerances. In one embodiment, the electrical-optical materials are spin-on EOPs that are compatible with standard CMOS processes and materials. In an alternative embodiment, the electrical-optical materials are ferroelectric oxides (e.g., LiNbO3), or piezoelectric materials (e.g., PLTZ), or electro-absorption materials (III-V or Germanium quantum well devices, where an electric signal controls the absorption of light), or Si (forming a Si CMOS capacitor). In one embodiment, PLC 830 is separated into multiple chips. In one embodiment, CPU 820, PLC 830, and laser 840 are packaged using Bumpless Buildup Layer (BBUL) technology. In one embodiment, WDM is used to increase aggregate bandwidth.

Figure 9:
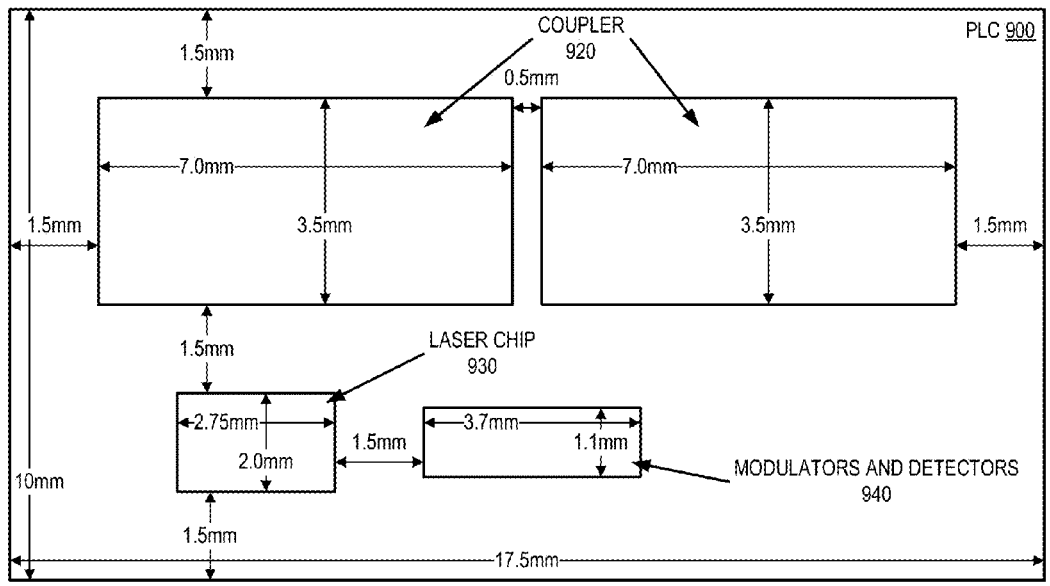
FIG. 9 is a block diagram of an embodiment of a layout of a configuration of components disposed on a planar light-wave circuit (PLC).

FIG. 9 is a block diagram of an embodiment of a layout of a configuration of components disposed on planar lightwave chip (PLC). Top view showing placement of components on PLC 900 having dimensions of 10 mm×17.5 mm for a particular embodiment. Other placing configurations are possible, as well as other dimensions.

Having transceiver logic (not specifically shown) on PLC 900 in close proximity to the modulator and photodetector devices 940 avoids high-speed signals (digital and photo-current) traveling long distances on package traces or on-die interconnects. Having PLC 900 close to the CPU (currently minimum distance is 1.5 mm, and shorter spacing is in development), increases the maximum signaling rate that can be achieved, decreases power consumption, and minimizes signal integrity risks. Laser chip 930 is also close to modulators and photodetectors 940. Couplers 920 provide an area to which the coupler device is to be attached to PLC 900, and to which optical fibers can be connected.

Figure 10:
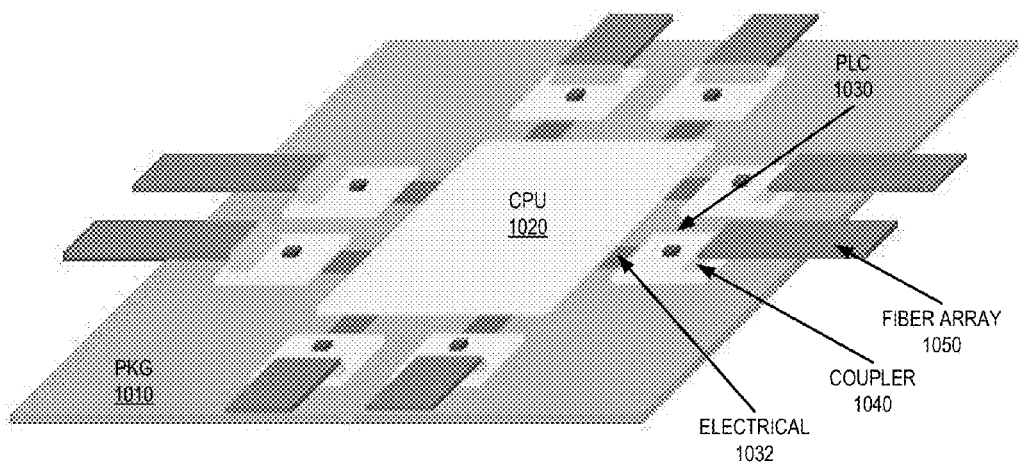
FIG. 10 is a block diagram of an embodiment of a system with multiple PLCs connecting multiple optical arrays to a processor on package.

FIG. 10 is a block diagram of an embodiment of a system with multiple PLCs connecting multiple optical arrays to a processor on package. System containing 8 PLCs and a CPU on a package, which can be an application for High-Performance Computing (HPC). Package 1010 is a package substrate to which CPU 1020 is attached. In one embodiment, multiple instances of photonic components are included on package 1010 with the single processor die.

More particularly, eight PLCs 1030 are shown coupled to CPU 1020 through electrical connections 1032. Each PLC 1030 represents one of the configurations of PLC that provides photonic components on the package according to any embodiment described above. PLC 1030 is shown having coupler 1040 attached to PLC 1030, allowing fiber array 1050 to interface with PLC 1030. In one embodiment, each fiber array 1050 is a two-dimensional fiber array, and each coupler 1040 is correspondingly a two-dimensional lens array. Such a lens array has two horizontal rows of lenses. Each PLC 1030 includes electrical-optical conversion circuitry, and appropriate transceiver logic (depending on the specific configuration) to enable the conversion between optical and electrical to occur physically close to CPU 1020.

Figure 11:
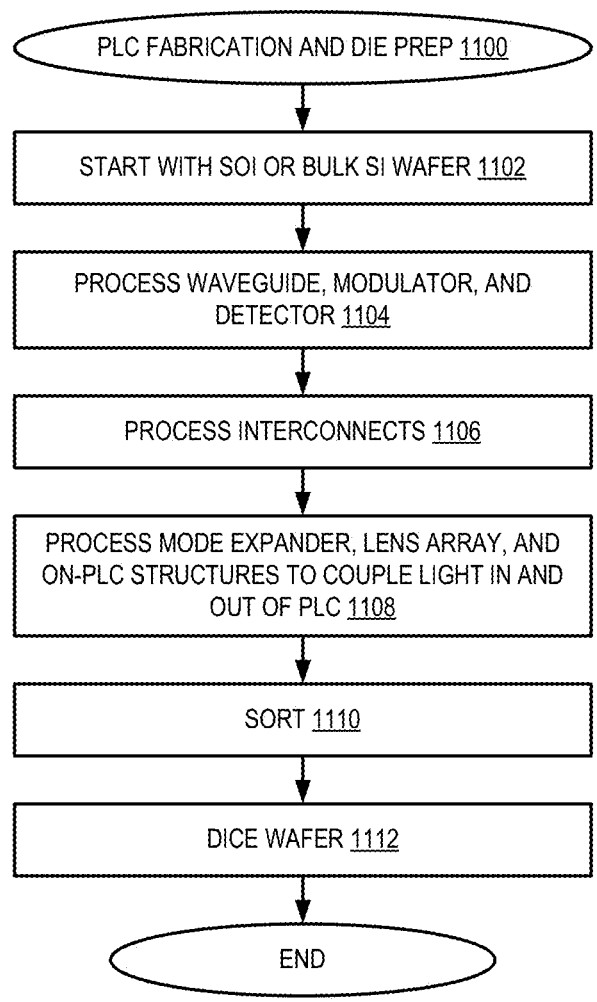
FIG. 11 is a flow diagram of an embodiment of a process for fabricating a PLC.

FIG. 11 is a flow diagram of an embodiment of a process for fabricating a PLC die. The PLC fabrication and die preparation process 1100 begins with a silicon-on-insulator (SOI) or bulk silicon wafer, 1102. In one embodiment, a fabrication system first processes onto the wafer waveguide(s), modulator(s), and photodetector(s), 1104. The components provide an optical pathway for signals. In one embodiment, the fabrication system then processes interconnects, which can include optical and/or electrical interconnections, 1106. In one embodiment, processing the interconnections include TSV processing. In one embodiment, the PLC die is thinned to make the processing of, and the processing with, TSVs easier.

In one embodiment, the fabrication system processes mode expander(s), lens array(s), and on-PLC structures to couple light in and out of the PLC, 1108. In one embodiment, the fabrication system includes electro-optical polymer (EOP) deposition and processing, including poling and passivation. The EOP cladding of the modulators provides electrical-optical conversion on the PLC. The fabrication system can sort the each individual die on the wafer, 1110. The sorting process involves testing and marking successful chips. The fabrication system then dices the wafer into the individual die, 1112, which can be used in the assembly of a processor as described herein.

Figure 12:
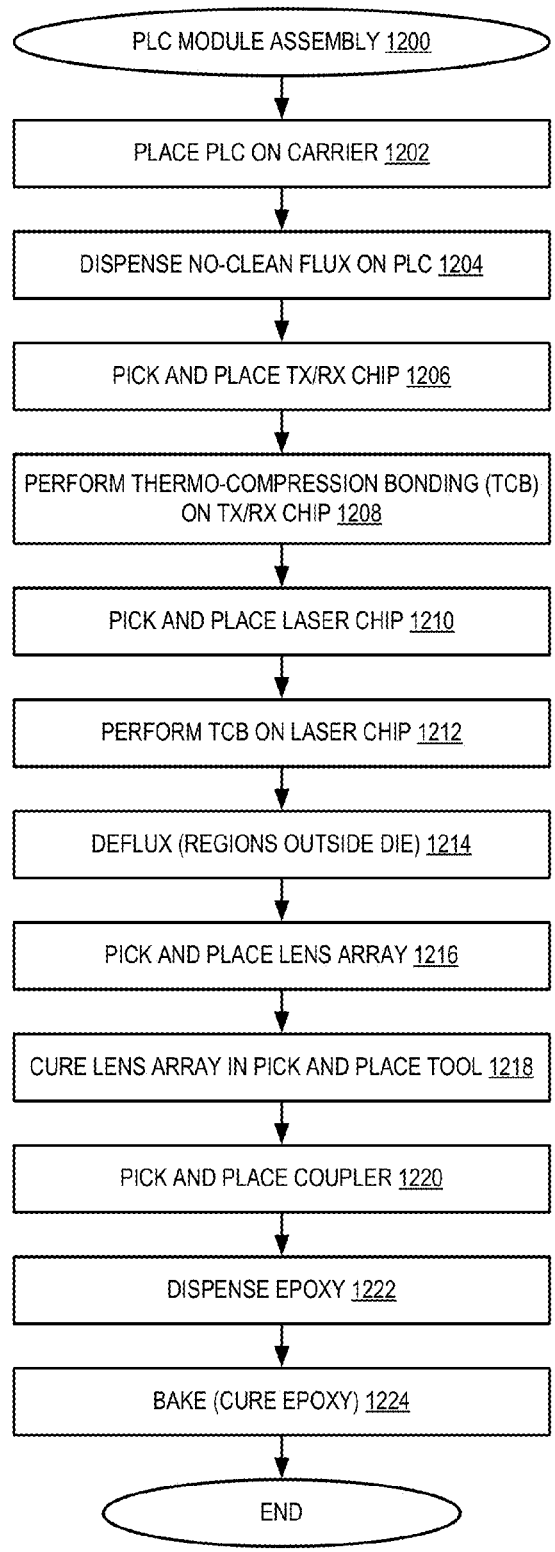
FIG. 12 is a flow diagram of an embodiment of a process for assembling a PLC module.

FIG. 12 is a flow diagram of an embodiment of a process for assembling a PLC module. A PLC module assembly process 1200 begins with placing a PLC die on a carrier, 1202. The PLC die can be a die prepared as described in FIG. 11. The PLC die is relatively small in dimension, and must be secured to be accurately processed. The carrier allows the die to be moved through the assembly system. In one embodiment, the assembly system dispenses no-clean flux on the PLC, 1204. The no-clean flux removes oxide from the solder interconnect ensuring good adherence during bonding while not requiring flux resin removal after bonding.

In one embodiment, the assembly system performs pick and place of a transceiver chip, 1206. In one embodiment, the transceiver chip is attached to the PLC via thermo-compression bonding (TCB), 1208. In one embodiment, the assembly system performs pick and place to place a laser chip on the PLC, 1210, and can then perform TCB on the laser chip to attach it to the PLC, 1212.

In one embodiment, the assembly system defluxes the regions outside the PLC die from flux that will have seeped onto other parts of the carrier, 1214. In one embodiment, rather than having a lens on the coupler, the coupling mechanism is separated into a lens array and a coupler. Thus, in one embodiment, the assembly system performs pick and place of a lens array, 1216. In one embodiment, the lens array is a two-dimensional array. In one embodiment, the assembly system cures the lens array in the pick and place tool, 1218. In an alternative embodiment, the lens could be cured at another time.

With the lens array in place, the assembly system can pick and place a coupler, 1220. The coupler enables the PLC to interface with a fiber bundle. The alignment of the coupler onto the lens array is significant, due to the optical coupling precision desired. In one embodiment, alignment mechanisms are in place to ensure proper alignment. The need for very precise alignment is one reason it may be preferable to cure the lens array in the pick and place tool. The coupler can be attached to the lens array by the assembly system dispensing epoxy, 1222, and baking the assembly to cure the epoxy, 1224. In an alternative embodiment, a coupler that includes a lens array is used in place of a separate array plus coupler. The use of a coupler with lenses would increase the complexity of the coupler, but may remove the need for many of the operations of the assembly system listed above.

Figure 13:
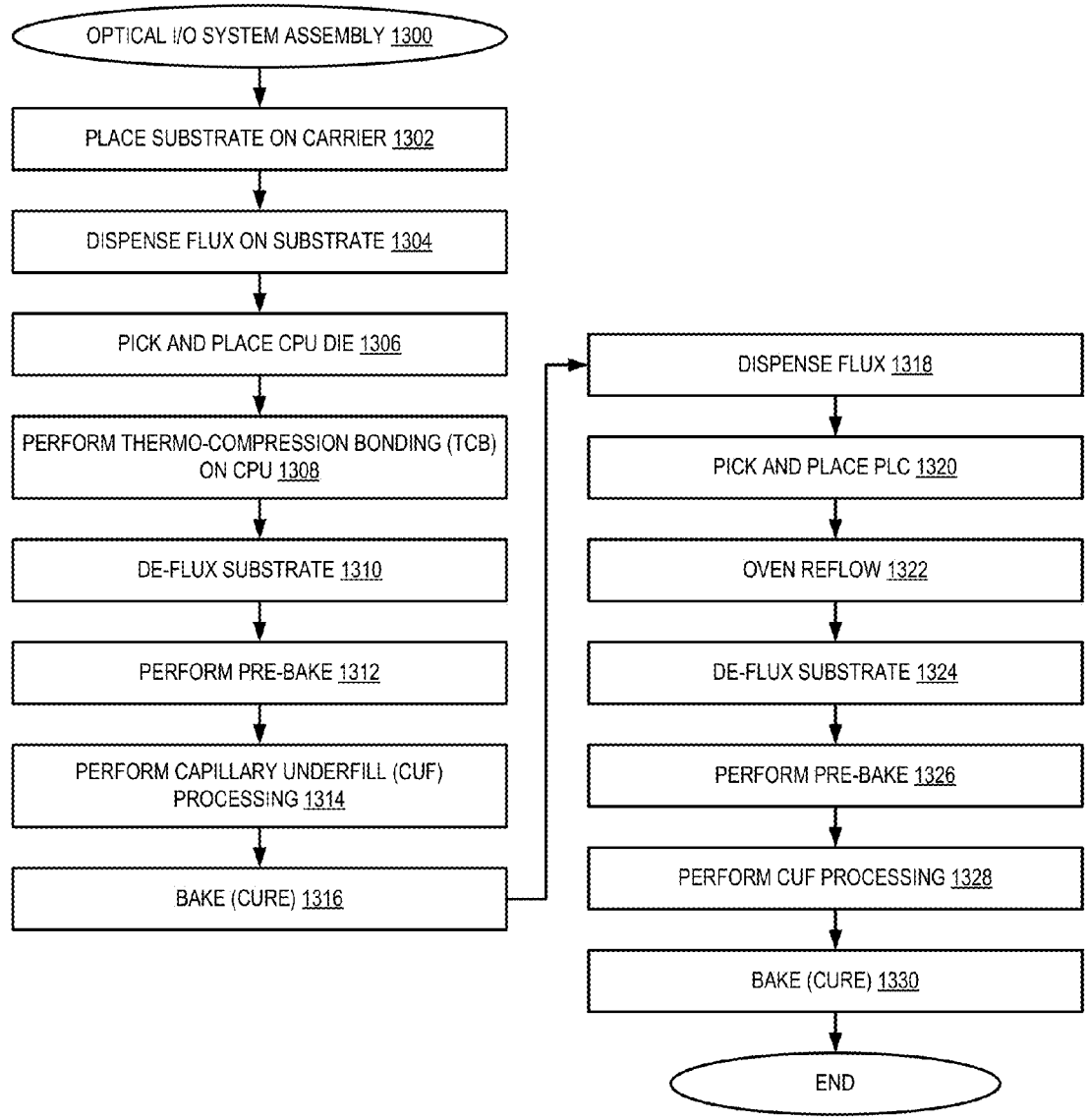
FIG. 13 is a flow diagram of an embodiment of a process for assembling a processor package with processor die and PLC.

FIG. 13 is a flow diagram of an embodiment of a process for assembling a processor package with processor die and PLC die. An embodiment of an optical I/O subsystem assembly 1300 begins by placing a substrate on a carrier, 1302. The substrate is the package substrate to which the processor die and the photonics components will be attached. It will be understood that many different processor configurations are disclosed above. Process 1300 is more specific to the configuration of system 300. Those of skill in the art will recognize how to modify process 1300 based on different configurations.

In one embodiment, the assembly system dispenses flux on the substrate, 1304, and performs pick and place of the CPU, 1306. The assembly system can set the CPU on the substrate by TCB, 1308. In one embodiment, the substrate is de-fluxed, 1310, to prepare it for the remainder of the processing. In one embodiment, there are many connections to be made to connect the processor die to the substrate, which can be achieved through capillary underfill (CUF). CUF processing starts with performing a pre-bake of the substrate, 1312, to heat the substrate to remove moisture from the package. The assembly system dispenses CUF and allows it to wick up and fill the gaps around the solder interconnections, 1314, and bakes or cures the underfill, 1316.

The assembly system then repeats the process for one or more PLC dies that will be placed on the substrate. Thus, the assembly system can dispense flux, 1318, pick and place the PLC die, 1320, and oven reflow the substrate, 1322. The assembly system can de-flux the substrate once reflow is completed, 1324. It will be understood that if a coupler is already mounted on the PLC (as disclosed in the example of process 1200), the coupler must be made of a material that can withstand the temperatures of reflow and CUF to use the assembly of process 1300. The assembly system performs a pre-bake on the substrate, 1326, to prepare before performing CUF processing, 1328. The assembly system finishes the process by baking the substrate to cure, 1330, the underfill.

Figure 14:
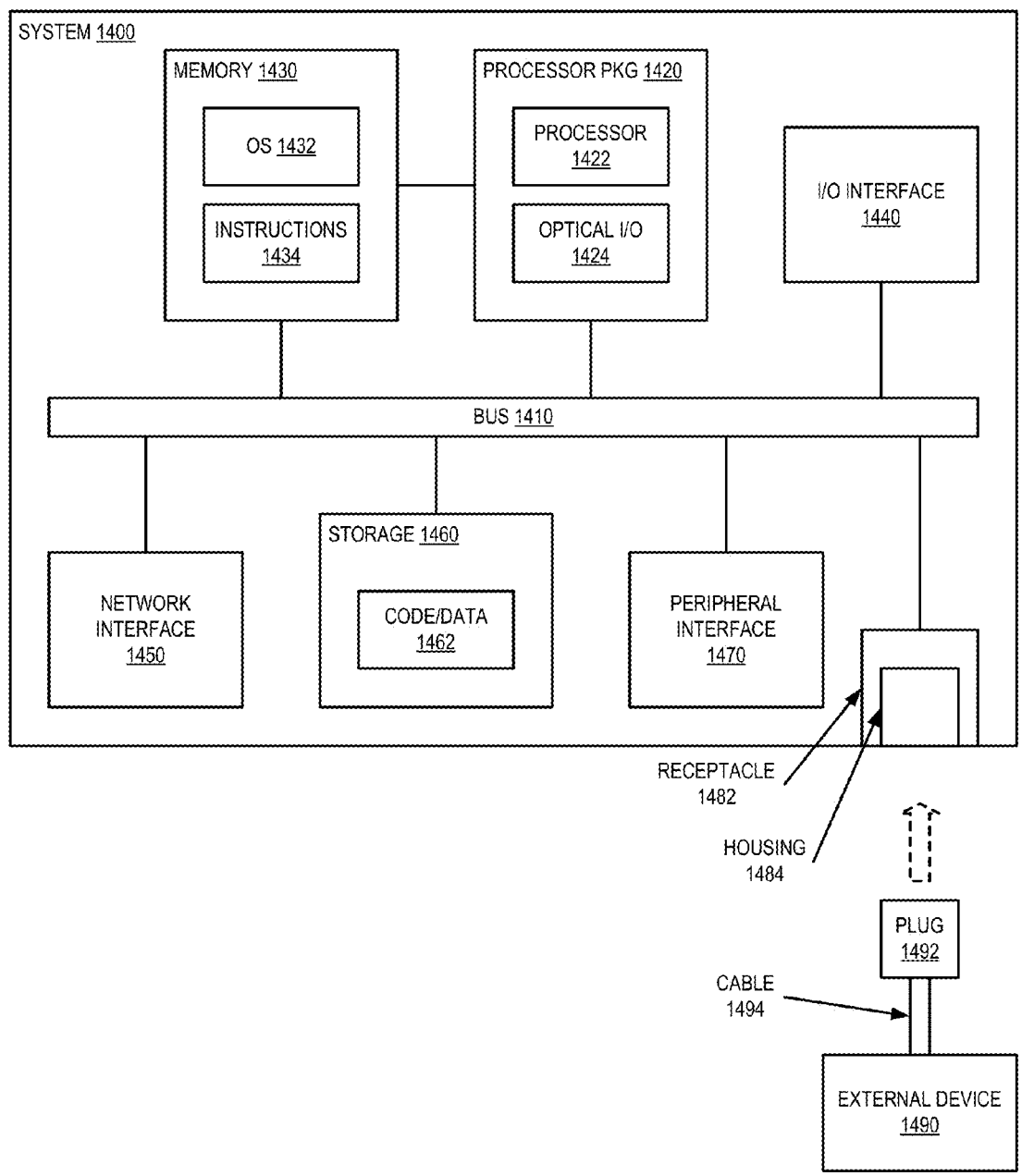
FIG. 14 is a block diagram of an embodiment of a computing system in which a processor package includes photonic components.

FIG. 14 is a block diagram of an embodiment of a computing system in which a processor package includes photonic components. System 1400 represents a computing device in accordance with any embodiment described herein, and can be a laptop computer, a desktop computer, a server, a gaming or entertainment control system, a scanner, copier, printer, or other electronic device. System 1400 includes processor 1422, which provides processing, operation management, and execution of instructions for system 1400. Processor 1422 can include any type of microprocessor, central processing unit (CPU), processing core, or other processing hardware to provide processing for system 1400. Processor 1422 controls the overall operation of system 1400, and can be include, one or more programmable general-purpose or special-purpose microprocessors, digital signal processors (DSPs), programmable controllers, application specific integrated circuits (ASICs), programmable logic devices (PLDs), or the like, or a combination of such devices.

Memory 1430 represents the main memory of system 1400, and provides temporary storage for code to be executed by processor 1422, or data values to be used in executing a routine. Memory 1430 can include one or more memory devices such as read-only memory (ROM), flash memory, one or more varieties of random access memory (RAM), or other memory devices, or a combination of such devices. Memory 1430 stores and hosts, among other things, operating system (OS) 1432 to provide a software platform for execution of instructions in system 1400. Additionally, other instructions 1434 are stored and executed from memory 1430 to provide the logic and the processing of system 1400. OS 1432 and instructions 1434 are executed by processor 1422.

Processor 1422 and memory 1430 are coupled to bus/bus system 1410. Bus 1410 is an abstraction that represents any one or more separate physical buses, communication lines/interfaces, and/or point-to-point connections, connected by appropriate bridges, adapters, and/or controllers. Therefore, bus 1410 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 1410 can also correspond to interfaces in network interface 1450.

System 1400 also includes one or more input/output (I/O) interface(s) 1440, network interface 1450, one or more internal mass storage device(s) 1460, and peripheral interface 1470 coupled to bus 1410. I/O interface 1440 can include one or more interface components through which a user interacts with system 1400 (e.g., video, audio, and/or alphanumeric interfacing). Network interface 1450 provides system 1400 the ability to communicate with remote devices (e.g., servers, other computing devices) over one or more networks. Network interface 1450 can include an Ethernet adapter, wireless interconnection components, USB (universal serial bus), or other wired or wireless standards-based or proprietary interfaces.

Storage 1460 can be or include any conventional medium for storing large amounts of data in a nonvolatile manner, such as one or more magnetic, solid state, or optical based disks, or a combination. Storage 1460 hold code or instructions and data 1462 in a persistent state (i.e., the value is retained despite interruption of power to system 1400). Storage 1460 can be generically considered to be a "memory," although memory 1430 is the executing or operating memory to provide instructions to processor 1422. Whereas storage 1460 is nonvolatile, memory 1430 can include volatile memory (i.e., the value or state of the data is indeterminate if power is interrupted to system 1400).

Peripheral interface 1470 can include any hardware interface not specifically mentioned above. Peripherals refer generally to devices that connect dependently to system 1400. A dependent connection is one where system 1400 provides the software and/or hardware platform on which operation executes, and with which a user interacts.

In one embodiment, system 1400 can include one or more receptacles 1482 with housing 1484 to receive plug 1492 or mate with plug 1492 to connect to external device 1490. Receptacle 1482 includes housing 1484, which provides the mechanical connection mechanisms. As used herein, mating one connector with another refers to providing a mechanical connection. The mating of one connector with another typically also provides a communication connection. Receptacle 1482 can connect directly to one or more buses of bus system 1410, or receptacle 1482 can be associated directly with one or more devices, such as network interface 1450, I/O interface 1440, storage 1460, or peripheral interface 1470.

Plug 1492 is a connector plug that allows external device 1490 (which can be any of the same types of devices discussed above) to interconnect with device 1400. Plug 1492 can be directly built into external device 1490 (with or without a cord or cable 1494), or can be interconnected to external device 1490 via a standalone cable. In one embodiment, plug 1492 supports communication via an optical interface or both an optical interface and an electrical interface. The interconnection of receptacle 1482 to bus 1410 can similarly include an optical path or both an optical and electrical signal path. Receptacle 1482 can also include an optical communication connection that is converted to an electrical signal prior to being placed on bus 1410.

In one embodiment, processor 1422 is part of a processor package 1420 that includes both the processor (die) and optical I/O components 1412. The optical I/O components enable the bringing of the optical I/O signals close to the processor, which can improve I/O performance in the system. Processor package 1420 can be a processor assembly in accordance with any embodiment described herein.

Figure 15:
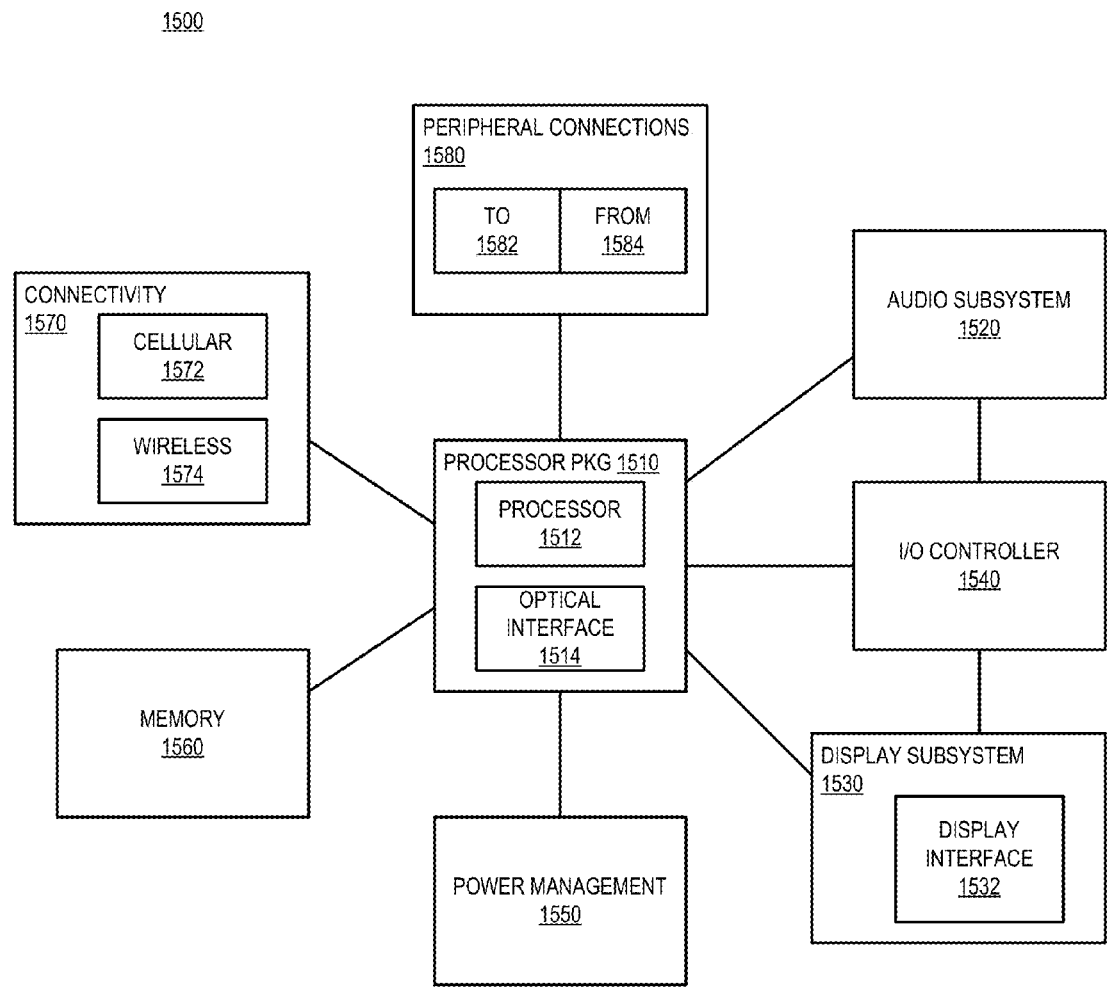
FIG. 15 is a block diagram of an embodiment of a mobile device in which a processor package includes photonic components.

FIG. 15 is a block diagram of an embodiment of a mobile device in which a processor package includes photonic components. Device 1500 represents a mobile computing device, such as a computing tablet, a mobile phone or smartphone, a wireless-enabled e-reader, or other mobile device. It will be understood that certain of the components are shown generally, and not all components of such a device are shown in device 1500.

Device 1500 includes processor package 1510, which includes processor 1512 that performs the primary processing operations of device 1500. Processor package 1510 can include one or more physical devices, such as microprocessors, application processors, microcontrollers, programmable logic devices, or other processing means. In one embodiment, processor package 1510 includes optical interface components 1514 in addition to a processor die 1512. Thus, the processor die and photonic components are in the same package, in accordance with any embodiment described herein.

The processing operations performed by processor 1512 include the execution of an operating platform or operating system on which applications and/or device functions are executed. The processing operations include operations related to I/O (input/output) with a human user or with other devices, operations related to power management, and/or operations related to connecting device 1500 to another device. The processing operations can also include operations related to audio I/O and/or display I/O.

In one embodiment, device 1500 includes audio subsystem 1520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1500, or connected to device 1500. In one embodiment, a user interacts with device 1500 by providing audio commands that are received and processed by processor 1512.

Display subsystem 1530 represents hardware (e.g., display devices) and software (e.g., drivers) components that provide a visual and/or tactile display for a user to interact with the computing device. Display subsystem 1530 includes display interface 1532, which includes the particular screen or hardware device used to provide a display to a user. In one embodiment, display interface 1532 includes logic separate from processor 1512 to perform at least some processing related to the display. In one embodiment, display subsystem 1530 includes a touchscreen device that provides both output and input to a user.

I/O controller 1540 represents hardware devices and software components related to interaction with a user. I/O controller 1540 can operate to manage hardware that is part of audio subsystem 1520 and/or display subsystem 1530. Additionally, I/O controller 1540 illustrates a connection point for additional devices that connect to device 1500 through which a user might interact with the system. For example, devices that can be attached to device 1500 might include microphone devices, speaker or stereo systems, video systems or other display device, keyboard or keypad devices, or other I/O devices for use with specific applications such as card readers or other devices.

As mentioned above, I/O controller 1540 can interact with audio subsystem 1520 and/or display subsystem 1530. For example, input through a microphone or other audio device can provide input or commands for one or more applications or functions of device 1500. Additionally, audio output can be provided instead of or in addition to display output. In another example, if display subsystem includes a touchscreen, the display device also acts as an input device, which can be at least partially managed by I/O controller 1540. There can also be additional buttons or switches on device 1500 to provide I/O functions managed by I/O controller 1540.

In one embodiment, I/O controller 1540 manages devices such as accelerometers, cameras, light sensors or other environmental sensors, gyroscopes, global positioning system (GPS), or other hardware that can be included in device 1500. The input can be part of direct user interaction, as well as providing environmental input to the system to influence its operations (such as filtering for noise, adjusting displays for brightness detection, applying a flash for a camera, or other features).

In one embodiment, device 1500 includes power management 1550 that manages battery power usage, charging of the battery, and features related to power saving operation. Memory subsystem 1560 includes memory devices for storing information in device 1500. Memory can include nonvolatile (state does not change if power to the memory device is interrupted) and/or volatile (state is indeterminate if power to the memory device is interrupted) memory devices. Memory 1560 can store application data, user data, music, photos, documents, other data, as well as system data (whether long-term or temporary) related to the execution of the applications and functions of system 1500.

Connectivity 1570 includes hardware devices (e.g., wireless and/or wired connectors and communication hardware) and software components (e.g., drivers, protocol stacks) to enable device 1500 to communicate with external devices. The device could be separate devices, such as other computing devices, wireless access points or base stations, as well as peripherals such as headsets, printers, or other devices.

Connectivity 1570 can include multiple different types of connectivity. To generalize, device 1500 is illustrated with cellular connectivity 1572 and wireless connectivity 1574. Cellular connectivity 1572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1574 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1580 include hardware interfaces and connectors, as well as software components (e.g., drivers, protocol stacks) to make peripheral connections. It will be understood that device 1500 could both be a peripheral device ("to" 1582) to other computing devices, as well as have peripheral devices ("from" 1584) connected to it. Device 1500 commonly has a "docking" connector to connect to other computing devices for purposes such as managing (e.g., downloading and/or uploading, changing, synchronizing) content on device 1500. Additionally, a docking connector can allow device 1500 to connect to certain peripherals that allow device 1500 to control content output, for example, to audiovisual or other systems.

In addition to a proprietary docking connector or other proprietary connection hardware, device 1500 can make peripheral connections 1580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A processor comprising:
   a package substrate;
   a processor die coupled to the package substrate; and
   a planar light-wave circuit (PLC) coupled to the processor die on the package substrate, the PLC including
      electrical-optical circuits coupled through the PLC using through-silicon vias (TSVs) to transceiver logic on the package substrate, the electrical-optical circuits to convert between an electrical signal and a corresponding optical signal, wherein the electrical-optical circuits include a laser to produce light and a transceiver to generate the optical signal using the light, and
      an optical coupler coupled through the PLC using through-silicon vias (TSVs) to the package substrate and coupled to the electrical-optical circuits to transfer the optical signal between the electrical-optical circuits and an optical fiber that extends off of the processor,
      wherein the optical coupler is integrated to the PLC using an interface including a mirror to redirect the optical signal from the PLC to the optical coupler.

2. The processor of claim 1, wherein at least part of the PLC is integrated into the package substrate.

3. The processor of claim 1, wherein the transceiver includes a transceiver logic chip disposed on the PLC.

4. The processor of claim 1, wherein the processor die includes transceiver logic integrated onto the processor die.

5. The processor of claim 1, wherein the electrical-optical circuits include waveguide elements integrated into the PLC.

6. The processor of claim 1, wherein the optical coupler comprises a two-dimensional lens array.

7. The processor of claim 1, wherein a first wave guide extends from the transceiver to the interface along the PLC and provides the optical signal to the mirror which reflects the optical signal away from the PLC and into the optical coupler.

8. The processor of claim 7, wherein a second wave guide extends from the laser to the transceiver to provide the light to the transceiver.

9. The processor of claim 1, wherein the transceiver includes a drive modulator to generate the optical signal from the light and the interface includes a mode expander to change a spot size of the optical signal.

* * * * *